(12) United States Patent
Kruck

(10) Patent No.: US 11,496,132 B2
(45) Date of Patent: Nov. 8, 2022

(54) DRIVE CIRCUIT

(71) Applicant: VISHAY SEMICONDUCTOR GMBH, Heilbronn (DE)

(72) Inventor: Achim Kruck, Pfedelbach (DE)

(73) Assignee: VISHAY SEMICONDUCTOR GMBH, Heilbronn (DE)

( * ) Notice: Subject to any disclaimer, the term of this patent is extended or adjusted under 35 U.S.C. 154(b) by 0 days.

(21) Appl. No.: 17/442,368

(22) PCT Filed: Mar. 23, 2020

(86) PCT No.: PCT/EP2020/058031
§ 371 (c)(1),
(2) Date: Sep. 23, 2021

(87) PCT Pub. No.: WO2020/193488
PCT Pub. Date: Oct. 1, 2020

(65) Prior Publication Data
US 2022/0190824 A1   Jun. 16, 2022

(30) Foreign Application Priority Data
Mar. 25, 2019   (DE) ......................... 102019107506.8

(51) Int. Cl.
*H03K 17/689* (2006.01)
*H03K 17/567* (2006.01)

(52) U.S. Cl.
CPC ......... *H03K 17/689* (2013.01); *H03K 17/567* (2013.01); *H03K 2217/0081* (2013.01)

(58) Field of Classification Search
CPC ............... H03K 17/689; H03K 17/567; H03K 2217/0081
See application file for complete search history.

(56) References Cited

U.S. PATENT DOCUMENTS

| | | | | |
|---|---|---|---|---|
| 2015/0318851 A1* | 11/2015 | Roberts | ................... | H01L 24/06 327/109 |
| 2016/0301408 A1 | 10/2016 | Roberts et al. | | |
| 2019/0067930 A1* | 2/2019 | Male | ..................... | H02H 3/093 |

FOREIGN PATENT DOCUMENTS

| | | |
|---|---|---|
| CA | 1087695 A | 10/1980 |
| DE | 2727130 A1 | 12/1977 |
| EP | 3166227 A1 | 5/2017 |

OTHER PUBLICATIONS

Vishay Semiconductors, "VO3150A; 0.5 A Output Current IGBT and MOSFET Driver," Jan. 14, 2010 (10 pages).

(Continued)

*Primary Examiner* — Metasebia T Retebo
(74) *Attorney, Agent, or Firm* — Volpe Koenig

(57) ABSTRACT

A drive circuit has a control signal input for receiving a first control signal at a first circuit input, an optocoupler which is connected to the control signal input and which is adapted to generate a galvanically decoupled second control signal in accordance with the first control signal, an output circuit for controlling at least one circuit output terminal of the drive circuit in accordance with a third control signal, and an electronic control circuit comprising an energy supply, an input for receiving the second control signal, and an output for outputting the third control signal in accordance with the second control signal received at the input.

19 Claims, 2 Drawing Sheets

(56) References Cited

OTHER PUBLICATIONS

Fairchild Semiconductor, "FOD3182, 3A Output Current, High Speed MOSFET Gate Driver Optocoupler," Feb. 2011 (23 pages).
Renesas, Data Sheet, "PS9305L, PS9305L2, 2.5 A Output Current, High CMR, IGBT Gate Drive, 8-PIN SDDIP Photocoupler," Sep. 7, 2011 (21 pages).
Avago Technologies, Data Sheet, "HCPL-3120/J312, HCNW3120, 2.5 Amp Output Current IGBT Gate Drive Optocoupler", Jul. 4, 2008 (24 pages).

* cited by examiner

DRIVE CIRCUIT

CROSS REFERENCE TO RELATED APPLICATIONS

This application is a 371 national phase application of International Application No. PCT/EP2020/058031, filed on Mar. 23, 2020, which claims priority to German Patent Application No. 10 2019 107 506.8, filed on Mar. 25, 2019, which are both incorporated by reference as if fully set forth herein.

FIELD OF INVENTION

The invention relates to a drive circuit for controlling electrical or electronic components, circuits, machines or equipment. Said drive circuit is intended to galvanically decouple the input side from the output side and therefore has a non-galvanic coupling, for instance, an optocoupler or an electromagnetic coupling or the like. Said drive circuit can receive a control signal at the input side from any desired sources, for instance from another electronic circuit or from a manually operated component such as a switch or a push button.

BACKGROUND

FIG. 3 schematically shows a possible circuit 90 in the form of an integrated circuit. At the input side, the circuit 90 is, for example, connected to a switch 91 which applies energy from a source 93 to a light emitting diode 94 via a resistor 92, for example. At the output side, the transistor to be driven is symbolized as a load 97 at a power source 98.

The circuit itself has an optocoupler 94, 95 at the input side. 94 is the radiation source, 95 are photovoltaic components which in total generate a voltage $V_{GS}$ in accordance with the power incident from the transmitter 94, said voltage $V_{GS}$ being provided to the control input of an FET 96 to switch it. The output of the circuit is formed by two terminals between which the FET 96 selectively produces a high-impedance state or a low-impedance state and in this manner provides a signal which may be used to control a subsequent IGBT or MOSFET.

The properties of this circuit are that it switches comparatively slowly since the power provided by the photovoltaics is comparatively low so that the recharging at the gate necessary for the switchover of the FET cannot take place very quickly. The switching through of the FET therefore does not take place too quickly so that in switching processes the FET is located for a long time in characteristic curve regions in which both the current through the FET and the source-drain voltage at the FET are comparatively high so that the losses and accordingly the heat development during switching are comparatively high. This may be tolerated for one-time switching processes. In contrast, it becomes noticeable in multiple switching processes, for instance, for pulse width modulation.

A further property of the circuit of FIG. 3 is that it requires a comparatively high input power since the power for switching over the FET 96 is ultimately supplied by the source 94 of the optocoupler and it has to be supplied continuously to hold at least one of the states.

Finally, it is also the case that the switching state at the output correlates directly with the switching state at the input. If the switch 91 at the input side of circuit 90 is closed, the MOSFET will have one of two possible states, and vice versa.

SUMMARY

It is the object of the invention to provide a drive circuit which can also switch large loads quickly and flexibly with a low power consumption at the input side.

This object is satisfied by the features of claim 1.

A drive circuit has a control signal input for receiving a first control signal at a first circuit input, a wireless coupler which is adapted to generate a galvanically decoupled second control signal in accordance with the first control signal, an electronic control circuit comprising an energy supply, an input for receiving the second control signal and an output for outputting a third control signal in accordance with the second control signal received at the input, and an output circuit for controlling at least one circuit output terminal of the drive circuit in accordance with the third control signal.

The control circuit may have a digital logic circuit for generating a digital signal as the third control signal and/or an analog signal processing circuit for generating an analog signal as the third control signal.

The control circuit in the drive circuit is provided with an energy supply and can thus generate the signals required for the control of the output circuit with a comparatively high power so that the setting or switching over in the output circuit can take place quickly.

The control circuit furthermore allows specific functions to be implemented in the drive circuit. The output signal of the control circuit may, but does not have to follow the input signal of the control circuit directly or proportionally. In general, the output signal of the control circuit may be a constant or time-variable signal which is generated in accordance with the input signal of the control circuit. For this purpose, the control circuit may be configured as a digital circuit or as an analog circuit which outputs a correspondingly digital or analog signal as the output signal of the control circuit which is suitably set or calibrated for the following use in the output circuit.

A digital output signal (in particular a binary signal having two states) of a digital circuit may be used as the third control signal, for example, to switch over switches of the output circuit. However, an analog signal may also be used for a correspondingly analog control and setting of the output circuit, for instance generated and used for a transistor thereof.

The control circuit may have a hold element which is adapted to generate the third control signal at its output in accordance with the second control signal and to hold it even if the second control signal changes after the generation. Said control circuit may also have a bistable circuit which, in response to an impulse at the input, switches the signal at the output from one stable state to the other stable state. The control circuit may also be or have a pulse width modulator working in accordance with a control parameter. It may also be or have a function generator working in accordance with a control parameter.

If the control circuit is configured as a hold element or as a bistable circuit, the input signals at the input of the control circuit and then also at the input of the drive circuit may accordingly be impulse-like overall. Thus, they do not have to be applied for a long time. In the case of a hold element, an input impulse may have the result that the control circuit switches from a stable state to a semi-stable state and falls back into the stable state after a certain time, which may differ from and in particular be longer than the impulse duration at the input. A short impulse of a few milliseconds may then, for example, result in a switchover at the output and in a longer holding of a signal switched over in this manner at the output before it falls back to the output state. The hold time may be preset or settable/decodable.

In a bistable circuit, each input impulse may result in a switchover from the respective currently applied stable state to the other stable state. The different output states of a bistable circuit may be different voltage values at the circuit output. The same applies to the output of a hold circuit.

The mode in which the control circuit works may also be switchable, for instance, between "bistable", "hold circuit" and the like.

The energy supply of the control circuit may be provided separately. In order not to cancel the galvanic separation between the input and the output, it is preferably not galvanically connected to the input side. The energy supply may, for example, have one or more separate terminals for the connection to an external voltage source. The drive circuit may e.g. have a supply voltage terminal and a ground terminal. A terminal, for example ground, may also be the supply terminal, for example ground, for a load.

However, the design may also be such that the internal energy supply of the control circuit is connected to a circuit output terminal of the drive circuit, that is to a terminal on which the output circuit acts, to draw electrical power from this output. The energy supply may then have a voltage-forming circuit which forms usable values from the values received. It may be a case of a down conversion, for example, which forms voltage values from comparatively high voltages at the circuit output which are usable for logic circuits, operational amplifiers, etc., for example, a DC voltage in the range between 4 V and 20 V or the like.

The energy supply may be adapted to generate the more or less constant DC voltage required for internal operation from comparatively high voltages which it receives from a circuit output terminal. Said energy supply may be adapted such that, at voltages of more than 100 V or more than 200 V or more than 500 V, it can generate suitable supply voltages for the control circuit. It may also have an energy store. Smoothing devices, for instance a capacitor, may also be provided.

However, the energy supply may also be adapted to generate the more or less constant DC voltage required from comparatively low voltages which it receives from a circuit output terminal (up conversion). This may be necessary if a transistor has switched to low impedance at the output and therefore only small voltage differences (of, for example, less than 1 V or less than 2 V) are applied at the output. Said energy supply may be adapted such that it may generate suitable supply voltages for the control circuit from voltages of less than 2 V or less than 4 V. It may also have an energy store. Smoothing devices, for instance a capacitor, may also be provided.

The wireless coupler may be an optocoupler or generally a coupler using electromagnetic radiation or a capacitive coupler or a magnetic coupler which generates suitable signals (DC voltage, AC voltage) at its output. Said wireless coupler may have a light emitting diode as a transmitter and a photodiode or a phototransistor as a receiver.

The control circuit may have suitable signal shaping circuits at its input, for instance, a rectifier and/or a smoothing device and/or an impedance converter and/or an amplifier. Signals from a wireless coupler are frequently comparatively weak so that it may be desired to suitably amplify them beyond the formatting in accordance with the values and to shape them in a stable manner (i.e. at a low internal resistance).

At the output, the control circuit may have an amplifier which generates the output voltage of the control circuit, the third control signal, in required value ranges. Depending on whether a digital output signal or an analog output signal of the control circuit is generated, two specific selected voltage levels may be set for a digital signal or a desired linear characteristic curve, defined by the operating point and the slope, may be implemented compared to the input signal for an analog signal. For this purpose, an amplifier may be provided at the output of the control circuit.

The output circuit may in turn have a switch, for instance, a transistor, an FET, a MOSFET or an IGBT. The collector and base or drain and source of the semiconductor element may be applied to and accessible at two output terminals of the drive circuit. If DC voltage is to be switched, a single semiconductor switch may be sufficient. If AC voltage is to be switched, two semiconductor switches, e.g. a respective n-channel and p-channel FET, may be provided connected in series if the breakdown voltage of a semiconductor switch is not sufficient in both polarities or if parasitic diodes would transmit leakage currents.

In general, the output circuit may switch (on-off) the state between two circuit output terminals between high-impedance and low-impedance, that is ultimately in a binary manner with two states, or it may output an analog signal or a binary signal to a circuit output terminal at a sufficiently low inner resistance for further controls.

The control circuit may work in accordance with a set or settable or adjusted or adjustable control parameter. For example, in the case of a hold element, the hold time may be set, adjusted, settable or adjustable. A further type of control parameter may be a mark space ratio for a pulse width modulation which is transmitted to the control circuit in a suitable manner. The control circuit may then be configured similarly to a PWM drive (PWM=pulse width modulation) and may output an impulse sequence with the desired mark space ratio and control the output circuit in this manner.

The functional circuit may also switch in a level-sensitive or threshold-sensitive manner, in particular switch on, switch off or switch over, optionally with hysteresis. It may e.g. detect and then switch to zero or a zero crossing of the second control signal or of the output signal of the input amplifier. This may be designed such that the drive circuit only switches on or off during the level crossing (zero crossing) of a variable input signal (AC signal), similar to a zero crossing TRIAC. "Zero" or "zero crossing" may here also be a small voltage, for instance, amounting to less than 2 V or less than 1 V or less than 0.5 V. A monitored level may be a voltage of more than 1 V or more than 2 V and/or less than 20, 10 or 5 V. The hysteresis offset which may be present may be more than 1 or 2 or 5 V and/or less than 50 or 20 or 10 or 5 V.

The drive circuit may have one or more input terminals in order to be able to input one or more control parameters, that is in particular to identify an input mode, if necessary, in order to then make an input and to end the input mode, if necessary. The input made may be stored in the control circuit in a suitable manner and used in the further process. The input may take place in an analog or digital manner, serially in time over at least one line or parallel in time over a plurality of lines.

It is also conceivable that a control parameter is coded onto the first control signal, for example, onto the impulse length of the signal at the signal input. The control circuit may then have a corresponding decoding device to be able to receive, store and subsequently use the encoded control parameter.

The drive circuit may be provided in a package. The package may be a (W)DIP ((wide)dual in line package) or an SOP (small outline package) or an LSOP (long small outline package) or an SOIC (small outline integrated circuit) package and may have a plurality of connection surfaces or connection wires. It may be an SMD (surface mounted device) having connection surfaces or connection legs. The circuit components therein may be provided on one semiconductor chip or provided distributed over two or more semiconductor chips which are suitably connected to one another, for instance, by bond connections or by traces of a circuit carrier.

The total circuit, the circuit elements and the connections among one another are adapted to conduct the required currents at the output side and to be able to keep the possibly applied voltages flashover-free. A load current in the output circuit may be at least or 1 or 2 or 5 or 10 or 20 A. A reverse voltage in the output circuit may be more than 30 or 50 or 100 or 200 or 500 or 1000 V. Accordingly, the voltage supply may also be adapted to work with such voltages.

Depending on the intended use, the circuit may have a cooling device or a heat sink which is placed onto the package or projects therefrom and conducts waste heat corresponding to electrical power loss away from the circuit. It may be a heat sink composed of a metallic material having cooling fins.

The drive circuit may be adapted to directly control an electrical consumer and may therefore conduct its consumer current in the switched-on state and block its supply voltage in the switched-off state. The consumer may be a motor or a phase of a motor or a lighting device or a charging device or a control device or a computer or a display or the like. The drive circuit may also be adapted to control an electronic switch, for example a MOSFET or an IGBT, for its part.

BRIEF DESCRIPTION OF THE DRAWINGS

Embodiments of the invention are described in the following with reference to the drawings, there are shown.

Figure 1:
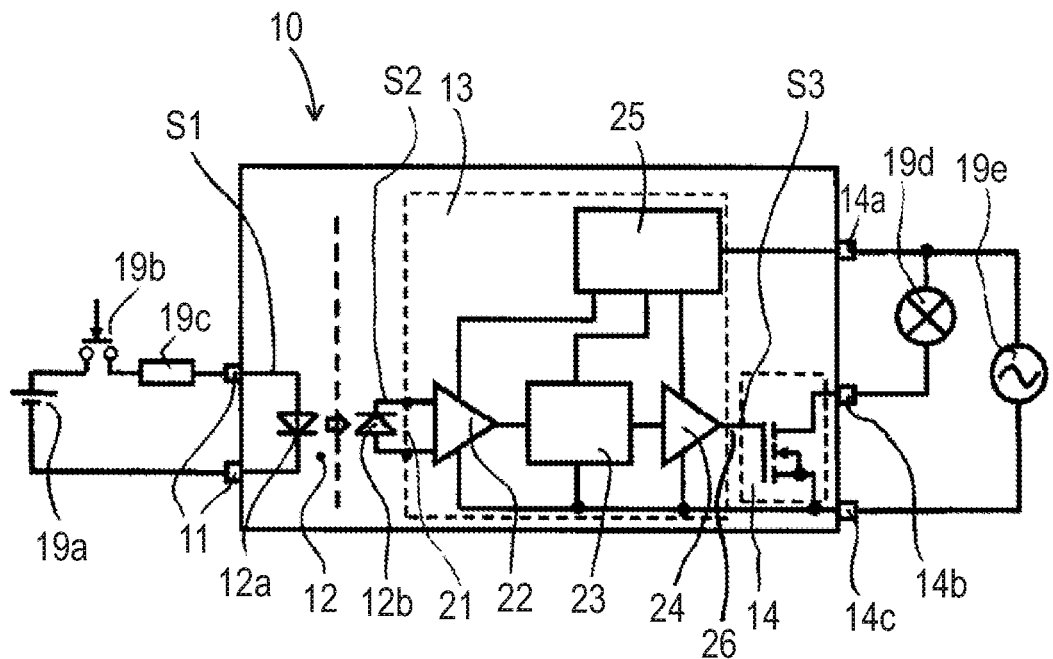
FIG. 1 a circuit diagram of a drive circuit,
FIG. 2 time diagrams, and
FIG. 3 a known drive circuit.

DETAILED DESCRIPTION 11 designates two input terminals in FIG. 1. They may be galvanically isolated with respect to the other circuit terminals and do not have any metallic or conductive or semiconductive connection thereto. The input terminals 11 serve for the connection of the drive circuit 10 to an input circuit which inputs a first control signal S1. A push button 19b is shown schematically which closes a power circuit, having a source 19a, via a protective resistor 19c.

The transmitter of a wireless coupler 12 is part of the power circuit. In FIG. 1, it is shown as a light emitting diode 12a. It generates radiation corresponding to the time duration of the actuation of the switch/push button 19b. The radiation intensity also correlates, within limits, with the voltage applied at the input terminals 11 or with the current conducted there.

The wireless coupler 12 of the drive circuit 10 also has a wireless receiver. It may be a phototransistor or a photodiode 12b. However, the wireless coupler 12 may also be a magnetic or electromagnetic coupler, which transmits and receives electromagnetically, or a capacitive coupler. Other coupling types without a galvanic connection of the components are also possible.

The output signal of the photodiode 12b is the second control signal S2 which is input into the control circuit 13. In one implementation, the photodiode may be built on a chip in a manner integrated with the control circuit 13.

In the embodiment shown, the control circuit 13 has a signal input 21 for the second control signal S2. Accordingly, the wireless receiver 12b is connected to the signal input 21. In the embodiment shown, the control circuit 13 has an input amplifier 22 which may be configured as an operational amplifier. Said input amplifier may carry out an amplification of the second control signal S2 or an impedance conversion or both or, at its output, it may overall produce a desired characteristic curve of the output variable above the input variable S2, e.g. regional linearity, possibly even in negative value ranges. The amplifier 22 at the input of the control circuit 13 is only shown schematically. It may have further circuit elements, not shown, for signal feedback, voltage division, current-to-voltage conversion, voltage-to-current conversion, gain adjustment (P component), dynamic adjustment (if necessary, I component and/or D component) and the like.

The control circuit 13 further has a functional circuit 23 which receives the amplified signal from the amplifier 22 at the input side. The functional circuit 23 may be a small digital or analog circuit in a simple case, for instance, a bistable flip-flop or a hold element (D flip-flop). It may have supply voltage terminals. Triggered by a signal at the input, the functional circuit 23 will show a specific signal at its output, for instance, in the case of a bistable flip-flop, a switchover for each incoming impulse from one currently applied stable state to the respective other stable state. The output of the functional circuit 23 may be used as the output signal of the control circuit, that is as the third control signal S3.

In the embodiment shown, a further amplifier 24 is, however, connected downstream of the functional circuit 23 and may actually amplify the signal or serves as impedance conversion for the signal considered.

The output circuit 14 is controlled by the control circuit 13 with the third control signal S3. It may be directly controlled by the functional circuit 23 or by the output-side amplifier 24 which apply the third control signal S3 to the output 26 of the control circuit 13.

Unlike as described above, the functional circuit 23 may also be more complex, however. It may have a memory for holding a control parameter. The memory may be of analog or digital design. The functional circuit 23 is then adapted to include the control parameter stored in this manner in the signal shaping. The control parameter may be predetermined or may arise in the course of the operation of the circuit 23 or be input into it.

An input apparatus for the control parameter can be very generally provided in this respect. It may have terminals (not shown) of the drive circuit 10 via which analog or digital values may be input and via which the write mode may also be distinguished from the operating mode. It may be a standardized input apparatus or the receiving part thereof.

The input device may generally have a decoding device via which one or more control parameters are decoded which were received and/or stored encoded. An encoded reception is in particular conceivable and possible via the wireless coupler 12 in that the first control signal S1, the input signal, is generated and input in a correspondingly encoded form at the circuit terminals 11. Here, the transmission may also include the selection of a write mode for the control parameter in that suitable signal encodings are transmitted. The functional circuit 23 may then perform appropriate decodings to be able to recognize the write mode, on the one hand, and to be able to decode the control parameter afterward, on the other hand. The coding may take place via time patterns, for example via impulse durations or the like. The functional circuit 23 may then be a more complex digital circuit, possibly with a small processor, registers and the like.

The input device may have an I²C interface (inter-integrated circuit) or an SPI interface (serial peripheral interface) as an input interface, in particular in each case the slave of such an interface. Its input signal may be the second control signal S2 which is then indirectly generated via the first control signal S1 in a suitable manner. Or the input interface-input signal may be supplied separately via a separate terminal in a suitable manner. The input interface may serve to input a control parameter for the functional circuit.

If necessary, the control circuit 13 may have an analog/digital converter at the input side, optionally after the input amplifier 22, and/or a digital/analog converter at the output side, optionally before the output amplifier 24. These converters may be integrated with the functional circuit 23 or may be provided separately.

25 is the energy supply of the control circuit 13. It may be integrated with said control circuit 13 or may be provided separately therefrom. It is connected to the energy supply 19e of the load 19d in the embodiment shown. The energy supply is applied to the drive circuit 10 via terminals 14c and 14a thereof. It may be a case of a DC voltage or an AC voltage. The energy supply 25 is adapted to be able to work with the respective nominal voltages, that is to rectify AC voltage or to generate a suitable DC voltage therefrom, for example. As already stated, the supply voltage of the source 19e may be comparatively high, in particular more than 30 or 50 or more than 100 or more than 200 or more than 500 V.

The energy supply 25 then supplies the functional circuit 23 and, if necessary, the amplifiers 22 and 24 with electrical energy. It may be a case of a DC voltage for operating the respective circuit components which may be in a range of a few volts, for example. The energy supply may have an energy store, not shown, or a smoothing capacitor or terminals therefor for the external connection of said energy supply.

In another embodiment, not shown, the energy supply 25 may have one or more terminals independently of the load 19d and may thus possibly be directly supplied with a usable voltage, such as a DC voltage to the amount of a few volts. It is to be preferred In this embodiment, as in the other embodiments, that the energy supply 25 is independent of the input side and its energy supply 19a and is not electrically connected to input-side terminals 11, but is rather galvanically separate therefrom.

The output circuit 14 of the drive circuit may, as shown, have a field effect transistor or generally a transistor. In the embodiment shown, said transistor may be operated as a switch to switch a load on and off. The output circuit then selectively sets the state between the two terminals 14b and 14c of the drive circuit to low impedance for "load on" and high impedance for "load off". On the one hand, the switch 14 is adapted to be able to maintain the reverse voltage, which may be applied at the level of the voltage of the voltage supply 19e, and, on the other hand, it is adapted to be able to conduct the load current of the load 19d which may be in the order of magnitude of some amperes or some 10 A. The transistor 14 is therefore preferably a power transistor which may handle high reverse voltages and high load currents. Accordingly, it requires a higher drive power at the input side to be able to effect the switchovers quickly. This is ensured by the control circuit 13 described, in particular in that an energy supply 25 is provided which provides the power required, optionally together with the output-side amplifier 24.

For specific applications, the switch 14 of the output circuit may also be operated in an "analog" manner in a further embodiment, it may therefore adopt target values at the output between "completely on" and "completely off", for instance, in order to provide specific voltages, currents or even patterns therefrom over time. The functional circuit 23 may then e.g. work as a function generator in accordance with one or more control parameters and may generate specific, preferably time-periodic, time patterns of current and/or voltage or have said function generator.

19d is the load to be switched. In one embodiment, it may be an electrical consumer, for instance, a motor or a motor phase, lighting, generally a machine, a control, a computer, a charging device or the like.

In another embodiment, the load may, in turn, again be a power transistor which is controlled by the drive circuit 10.

If the load 19d is a motor or the phase of a motor, the drive circuit 13 may be used for pulse width modulation. However, the same may also apply to other consumers, for instance, to lighting devices.

The voltage source 19e may be a DC voltage source or an AC voltage source. It may be the public mains network (110/230 V, 50/60 Hz). However, it may also be a three-phase current (380 V) or any other type of electrical power supply.

Unlike what is shown, the output circuit 14 may have two transistors of different designs connected in series. This is in particular to be preferred if AC voltage is to be switched from the current source 19e. The transistor designs may then be selected such that a respective one is particularly suitable for blocking one of the two possible polarities.

Unlike what is shown, the drive circuit 10 may also be adapted to output a signal at a terminal, which signal is shaped with respect to ground, for example. The signal then serves to control other components and not primarily to switch a consumer on and off.

Figure 2:
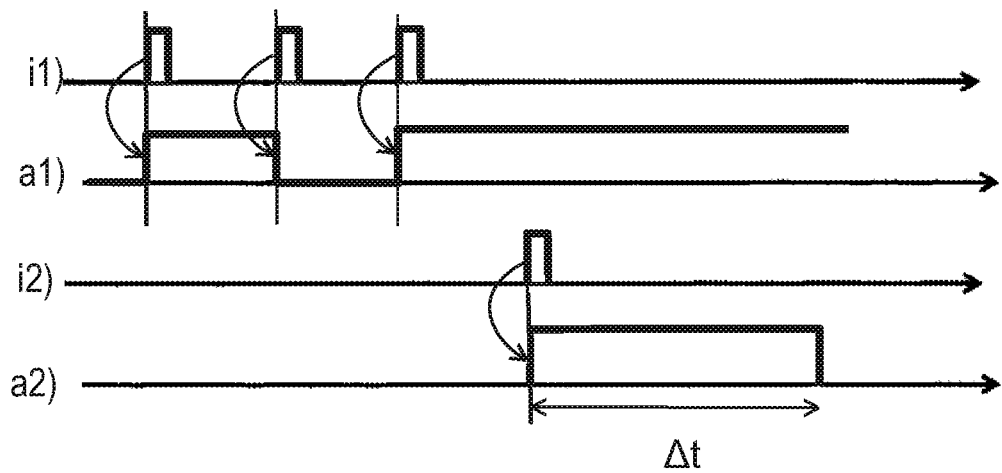
Figure 3:
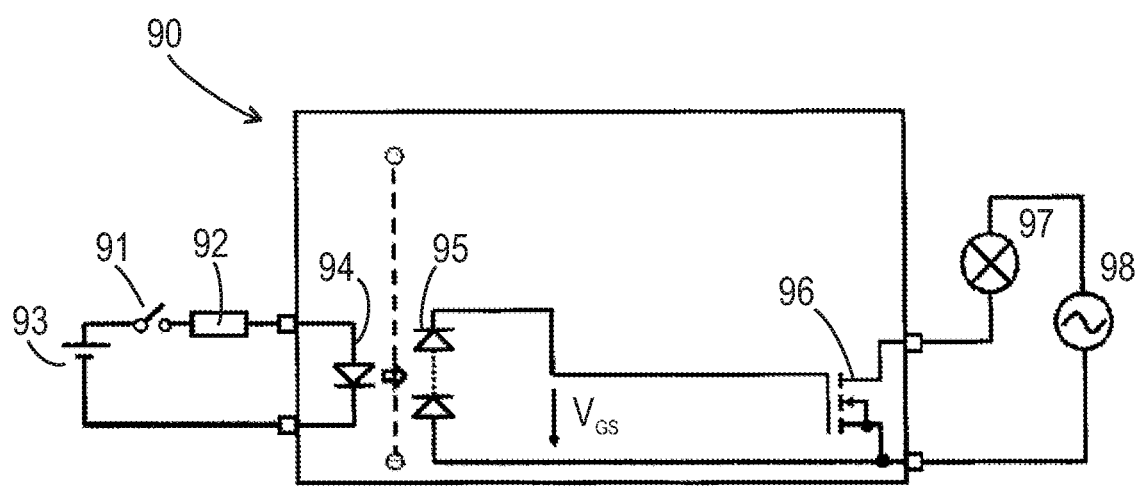

FIG. 2 shows operating modes which are possible for the functional circuit 23 or generally for the control circuit 13. A first input signal sequence is shown by i1 which may, for example, be generated by the push button 19b and applied to the circuit input 11. It is a case of a sequence of impulses which may have any desired spacing. The impulses may be generated by a circuit or, for example, by human keying using the switch 19b. A respective impulse has the result that the output of the control circuit 13 is switched from one stable state to the other stable state as shown in FIG. 2 a1. It may be an on/off keying of a lighting device, for example.

FIG. 2 i2 shows a further input signal sequence with only one single impulse. It may have the result that a longer impulse arises at the output 26 and is set back again after a specific time Δt. The time Δt is a control parameter which is either fixed or settable or adjustable using the above-described possibilities.

An embodiment of the drive circuit which may optionally be combined with one or more of the features described above is in particular electrically and thermally adapted to directly control a consumer, that is to conduct its load current or at least a phase thereof in the on state, to block its operating voltage in the off state and to switch between the states at the desired switching frequency.

Such an embodiment has a control signal input 11 for receiving a first control signal S1 at a first circuit input, a wireless coupler 12 which is connected to the control signal input and which is adapted to generate a galvanically decoupled second control signal S2 in accordance with the first control signal S1, and an output circuit 14 for controlling at least one circuit output terminal 14b, 14c of the drive circuit for the consumer in accordance with a third control signal S3. It has a drive section 13 comprising an energy supply, an input for receiving the second control signal, and an output for outputting the third control signal S3 in accordance with the second control signal S2 received at the input.

In a simple case, the second control signal S2 may be directly used as the third control signal S3. However, an impedance conversion, an amplification or another linear scaling which convert the second control signal S2 into the third control signal S3 may also be disposed between the two signals. One of the more complex functional circuits mentioned may also be provided. The energy supply then at least serves for the operation of the output circuit 14 and, optionally, of the wireless coupler or of the amplifier or of the impedance converter such that the output circuit 14 may be switched quickly and reliably.

The package of the drive circuit may have one or more cooling apparatus, for instance one or more metallic cooling surfaces in the package wall and/or one or more cooling fins which project from the actual body and which are thermally connected to the interior.

The consumer connectable to the drive circuit may have a load current, possibly in one of its phases, of at least 0.1 or 1 or 2 or 5 or 10 or 20 A. Its operating voltage may be above 30 or 50 or 100 or 200 or 500 or 1000 V.

The drive circuit may be adapted for a switching on and off at relatively high switching frequencies, for instance for switching frequencies of more than 1 or 2 or 5 or 10 or 20 kHz. These switching frequencies may be desired for PWM applications, for example. The energy supply circuit 25 is then in particular adapted to provide the energy necessary for the correspondingly fast and frequent recharging of the internal capacitors of the semiconductor switches.

In contrast, the design for other applications, for instance lighting control, may be such that the drive circuit is not suitable and adapted for high frequencies like above and is only adapted for the operation for frequencies below the above-mentioned limits, possibly also only for operation below 500 Hz or below 200 Hz or below 100 Hz. This may in particular relate to the energy supply circuit 25 which may then be designed correspondingly smaller. Design features caused by a thermal aspect may then also be less complex. Cooling elements or cooling fins may possibly be omitted.

The drive circuit may be an integrated circuit. It may be accommodated in a standard package, for instance in a DIP (dual in line package), a WDIP (wide dual in line package), an SOP (small outline package), an LSOP (long small outline package) or an SOIC (small outline integrated circuit) package.

The circuit elements of the integrated circuit may be accommodated on one or more semiconductor chips. The functional circuit 23 and possibly the input and output amplifiers 22, 24 may be built on a common chip. Components of the energy supply 25 and the receiver 12b of the wireless coupler 12 may also be built on chips or circuit carriers separate therefrom or on the same chip. The semiconductor switch of the output circuit 14 may be built on a separate chip. The different chips are suitably connected to one another in the integrated circuit.

Features in this description and in the claims should be understood as combinable with one another even if their combination is not explicitly described provided that the combination is technically possible. Features described in a specific context, in an embodiment of a Figure or in a claim should also be understood as removable from this claim, context, embodiment or Figure and combinable with any other Figure, embodiment, claim and context provided that this is technically possible. Embodiments should not be understood as mutually exclusive. Descriptions of a method or of a process or of a method step or process step should also be understood as a description of a device for carrying out the method or the process or the method step or the process step, and vice versa.

REFERENCE NUMERAL LIST 10 drive circuit
11 input terminals
12 wireless coupler
12a light emitting diode
12b photodiode
13 control circuit
14 output circuit
21 signal input
22 input amplifier
23 functional circuit
24 output amplifier
25 energy supply
26 signal output
14a, 14b, 14c output terminals
19a voltage source
19b switch, push button
19c protective resistor
19d consumer
19e energy supply

The invention claimed is:

1. A drive circuit comprising:
   a control signal input for receiving a first control signal,
   a wireless coupler which is connected to the control signal input and which is adapted to generate a galvanically decoupled second control signal in accordance with the first control signal,
   an output circuit for controlling at least one circuit output terminal of the drive circuit in accordance with a third control signal, and
      an electronic control circuit comprising an energy supply, an input for receiving the second control signal, and an output for outputting the third control signal in accordance with the second control signal received at the input,
   wherein the energy supply of the control circuit is integrated into the control circuit and is adapted to receive energy from the at least one circuit output terminal of the drive circuit via a connection within the drive circuit.

2. The drive circuit according to claim 1, wherein the control circuit has a digital logic circuit.

3. The drive circuit according to claim 1, wherein the control circuit has a hold element which is adapted to generate the third control signal at its output in accordance with the second control signal and to hold it even if the second control signal changes after the generation.

4. The drive circuit according to claim 1, wherein the control circuit has a bistable circuit which, in response to an impulse at the input, switches the signal at the output from one stable state to the other stable state.

5. The drive circuit according to claim 1, wherein the output circuit is adapted to switch a load, and the energy supply of the control circuit is connected to an energy supply of the load which may have a DC voltage or AC voltage of more than 100 V or more than 200 V or more than 500 V.

6. The drive circuit according to claim 1, wherein, at the input, the control circuit has an amplifier for amplifying the second control signal.

7. The drive circuit according to claim 1, wherein, at the output, the control circuit has an amplifier for outputting the third control signal.

8. The drive circuit according to claim 1, wherein the output circuit has one transistor or two transistors connected in series.

9. The drive circuit according to claim 1, wherein the output circuit controls the electrical connection between two circuit outputs.

10. The drive circuit according to claim 1, wherein the output circuit is adapted to apply a digital or analog signal to a circuit output of the drive circuit.

11. The drive circuit according to claim 1, comprising a setting device for setting a control parameter of the control circuit, wherein the setting device has at least one of a first decoding device for decoding the control parameter from a correspondingly generated parameter of the second control signal or a second decoding device for decoding the control parameter from one or more electrical values at one or more second circuit inputs.

12. The drive circuit according to claim 1 the drive circuit being molded in a package, wherein the circuit has a heat sink which projects from the package or which is placed onto the package.

13. The drive circuit according to claim 1, wherein the drive circuit is adapted to directly control an electrical consumer, the electrical consumer being at least one of an electric motor, a lighting device, a charging device, a control device, a computer or a display.

14. The drive circuit according to claim 1, wherein the drive circuit is adapted to control an electronic switch, the electronic switch being a metal—oxide—semiconductor field-effect transistor (MOSFET) or an insulated-gate bipolar transistor (IGBT).

15. The drive circuit according to claim 1, wherein the drive circuit is adapted to at least one of conduct a current of at least 0.1 or 1 or 2 or 5 or 10 A at an output terminal, or to switch a DC voltage or AC voltage of at least 30 or 50 or 100 or 200 or 500 V.

16. The drive circuit according to claim 8 wherein the one transistor is a MOSFET, or the two transistors are MOSFETs.

17. The drive circuit according to claim 1, wherein the output circuit controls the electrical connection between two circuit outputs between a high-impedance state and a low-impedance state.

18. A drive circuit comprising:
a control signal input for receiving a first control signal,
a wireless coupler which is connected to the control signal input and which is adapted to generate a galvanically decoupled second control signal in accordance with the first control signal,
an output circuit for controlling at least one circuit output terminal of the drive circuit in accordance with a third control signal, and
an electronic control circuit comprising an energy supply, an input for receiving the second control signal, and an output for outputting the third control signal in accordance with the second control signal received at the input,
wherein the control circuit has a hold element which is adapted to generate the third control signal at its output in accordance with the second control signal and to hold it even if the second control signal changes after the generation.

19. A drive circuit comprising:
a control signal input for receiving a first control signal,
a wireless coupler which is connected to the control signal input and which is adapted to generate a galvanically decoupled second control signal in accordance with the first control signal,
an output circuit for controlling at least one circuit output terminal of the drive circuit in accordance with a third control signal, and
an electronic control circuit comprising an energy supply, an input for receiving the second control signal, and an output for outputting the third control signal in accordance with the second control signal received at the input,
wherein the control circuit has a bistable circuit which, in response to an impulse at the input, switches the signal at the output from one stable state to the other stable state.

* * * * *